United States Patent
Monge Roffarello et al.

(10) Patent No.: US 12,211,754 B2
(45) Date of Patent: Jan. 28, 2025

(54) SEMICONDUCTOR CHIP MANUFACTURING METHOD

(71) Applicants: STMicroelectronics S.r.l., Agrate Brianza (IT); STMicroelectronics (Crolles 2) SAS, Crolles (FR)

(72) Inventors: Pierpaolo Monge Roffarello, Milan (IT); Isabella Mica, Sesto San Giovanni (IT); Didier Dutartre, Meylan (FR); Alexandra Abbadie, Montbonnot-Saint-Martin (FR)

(73) Assignees: STMicroelectronics S.r.l., Agrate Brianza (IT); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/729,191

(22) Filed: Apr. 26, 2022

(65) Prior Publication Data

US 2022/0352028 A1  Nov. 3, 2022

(30) Foreign Application Priority Data

Apr. 29, 2021 (FR) ..................... 2104505

(51) Int. Cl.
*H01L 21/8249* (2006.01)
*H01L 21/02* (2006.01)
*H01L 21/324* (2006.01)
*H01L 21/763* (2006.01)
*H01L 27/06* (2006.01)

(52) U.S. Cl.
CPC .... *H01L 21/8249* (2013.01); *H01L 21/02381* (2013.01); *H01L 21/02428* (2013.01); *H01L 21/02532* (2013.01); *H01L 21/02579* (2013.01); *H01L 21/02598* (2013.01);
(Continued)

(58) Field of Classification Search
None
See application file for complete search history.

(56) References Cited

U.S. PATENT DOCUMENTS 4,314,595 A  2/1982  Yamamoto et al.
4,548,654 A  10/1985  Tobin
(Continued)

FOREIGN PATENT DOCUMENTS

EP  1475829 A1  11/2004
EP  2096667 A2  9/2009

OTHER PUBLICATIONS

Deren Yang et al: "Impurity engineering of Czochralski silicon used for ultra large-scaled-integrated circuits", Journal of Crystal Growth, Elsevier, Amsterdam, NL, vol. 311, No. 3, Oct. 14, 2008 (Oct. 14, 2008), pp. 837-841, XP025947303.
(Continued)

*Primary Examiner* — Jack S Chen
(74) *Attorney, Agent, or Firm* — Crowe & Dunlevy LLC

(57) ABSTRACT

A substrate made of doped single-crystal silicon has an upper surface. A doped single-crystal silicon layer is formed by epitaxy on top of and in contact with the upper surface of the substrate. Either before or after forming the doped single-crystal silicon layer, and before any other thermal treatment step at a temperature in the range from 600° C. to 900° C., a denuding thermal treatment is applied to the substrate for several hours. This denuding thermal treatment is at a temperature higher than or equal to 1,000° C.

18 Claims, 3 Drawing Sheets

(52) U.S. Cl.
CPC .......... *H01L 21/324* (2013.01); *H01L 21/763* (2013.01); *H01L 27/0623* (2013.01)

(56) References Cited

U.S. PATENT DOCUMENTS

| | | | |
|---|---|---|---|
| 4,631,803 A * | 12/1986 | Hunter | H01L 21/76202 257/520 |
| 6,100,149 A | 8/2000 | Nenyei et al. | |
| 7,601,606 B2 | 10/2009 | Brunier et al. | |
| 8,753,987 B2 | 6/2014 | Yukinobu et al. | |
| 8,963,146 B2 | 2/2015 | Yukinobu et al. | |
| 2005/0087830 A1 * | 4/2005 | Takeno | H01L 21/3225 257/E21.321 |
| 2006/0084222 A1 | 4/2006 | Rennie et al. | |
| 2007/0020886 A1 | 1/2007 | Brunier et al. | |
| 2009/0102024 A1 | 4/2009 | Takahi et al. | |
| 2012/0322229 A1 | 12/2012 | Castex | |
| 2015/0187597 A1 | 7/2015 | Sucher et al. | |

OTHER PUBLICATIONS

Sui R Ket al: "The Effects of Substrate Oxygen Content and Preannealing on the Properties of Silicon Epitaxial Layers", Journal of The Electrochemical Society,, vol. 131, No. 1, Jan. 1, 1984 (Jan. 1, 1984), pp. 180-185, XP000840992.

* cited by examiner

SEMICONDUCTOR CHIP MANUFACTURING METHOD

PRIORITY CLAIM

This application claims the priority benefit of French Application for Patent No. 2104505, filed on Apr. 29, 2021, the content of which is hereby incorporated by reference in its entirety to the maximum extent allowable by law.

TECHNICAL BACKGROUND

The present disclosure generally concerns the field of semiconductor integrated circuit chip manufacturing methods.

BACKGROUND

The manufacturing of semiconductor integrated circuit chips in BIPOLAR-CMOS-DMOS (BCD) technology, that is, integrated circuit chips comprising at the same time bipolar transistors, Complementary Metal Oxide Semiconductor (CMOS) transistors, and Double Diffused Metal Oxide Semiconductor (DMOS) transistors, is more particularly considered herein.

Known methods of manufacturing semiconductor integrated circuit chips in BCD technology have various disadvantages that it would be desirable to totally or partly overcome.

There is a need in the art to address all or part of the disadvantages of known methods of manufacturing semiconductor integrated circuit chips in BCD technology.

SUMMARY

One embodiment provides a method of manufacturing a semiconductor integrated circuit chip, comprising the steps of: a) providing a substrate made of doped single-crystal silicon; b) forming by epitaxy, on top of and in contact with the upper surface of the substrate, a doped single-crystal silicon layer; and c) before or after step b), and before any other thermal treatment step at a temperature in the range from 600° C. to 900° C., applying to the substrate a denuding thermal treatment, at a temperature higher than or equal to 1,000° C. for several hours.

According to an embodiment, the substrate is P-type doped and the single-crystal silicon layer is P-type doped.

According to an embodiment, the substrate has a first doping level, and the single-crystal silicon layer has a second doping level lower than the first doping level.

According to an embodiment, the substrate has a doping level greater than $5*10^{17}$ atoms/cm$^3$, for example greater than $10^{18}$ atoms/cm$^3$.

According to an embodiment, the substrate is boron-doped.

According to an embodiment, the epitaxial layer has a doping level smaller than $10^{16}$ atoms/cm$^3$, for example, in the order of $10^{15}$ atoms/cm$^3$.

According to an embodiment, at step c), the substrate is maintained at a temperature higher than or equal to 1,100° C. for at least four hours.

According to an embodiment, the method comprises, after steps b) and c), a step of forming of vertical insulation trenches crossing the epitaxial layer and emerging into the semiconductor substrate.

According to an embodiment, the method comprises a step of forming of an insulating layer on the lateral walls and at the bottom of the trenches, and a step of filling of the trenches with an electrically-conductive material, for example, polycrystalline silicon.

Another embodiment provides a method of manufacturing a semiconductor substrate, comprising the steps of: a) providing a first semiconductor substrate made of doped single-crystal silicon; b) forming by epitaxy, on top of and in contact with the upper surface of the first semiconductor substrate, a doped single-crystal silicon layer (103); and c) before or after step b), and before any other thermal treatment step at a temperature in the range from 600° C. to 900° C., applying to the first semiconductor substrate a denuding thermal treatment, at a temperature higher than or equal to 1,000° C. for several hours.

Another embodiment provides a device comprising a doped single-crystal silicon substrate and, on top of and in contact with the upper surface of the doped single-crystal silicon substrate, a doped epitaxial single-crystal silicon layer, wherein the doped single-crystal silicon substrate comprises a denuded upper layer having an interstitial oxygen concentration smaller than the interstitial oxygen concentration of a lower portion of the doped single-crystal silicon substrate, said denuded layer extending from the upper surface of the doped single-crystal silicon substrate and having a thickness greater than or equal to 15 μm.

According to an embodiment, the doped single-crystal silicon substrate is P-type doped and the single-crystal silicon layer is P-type doped.

According to an embodiment, the doped single-crystal silicon substrate has a first doping level, and the single-crystal silicon layer has a second doping level lower than the first doping level.

According to an embodiment, the denuded layer has a BMD density smaller than the BMD density of the lower portion of the doped single-crystal silicon substrate.

According to an embodiment, the device comprises a lateral insulation trench, said trench extending vertically through the epitaxial layer and emerging into the denuded layer of the doped single-crystal silicon substrate.

According to an embodiment, a distance greater than or equal to 10 μm separates the bottom of the lateral insulation trench from the lower surface of the denuded layer.

According to an embodiment, the device comprises transistors formed inside and on top of the epitaxial layer.

According to an embodiment, said transistors comprise bipolar transistors, CMOS transistors, and DMOS transistors.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE DRAWINGS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, only certain steps of the semiconductor integrated circuit chip manufacturing have been detailed. The complete forming of the semiconductor integrated circuit chips is within the abilities of those skilled in the art by using known steps of a semiconductor integrated circuit chip manufacturing method.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
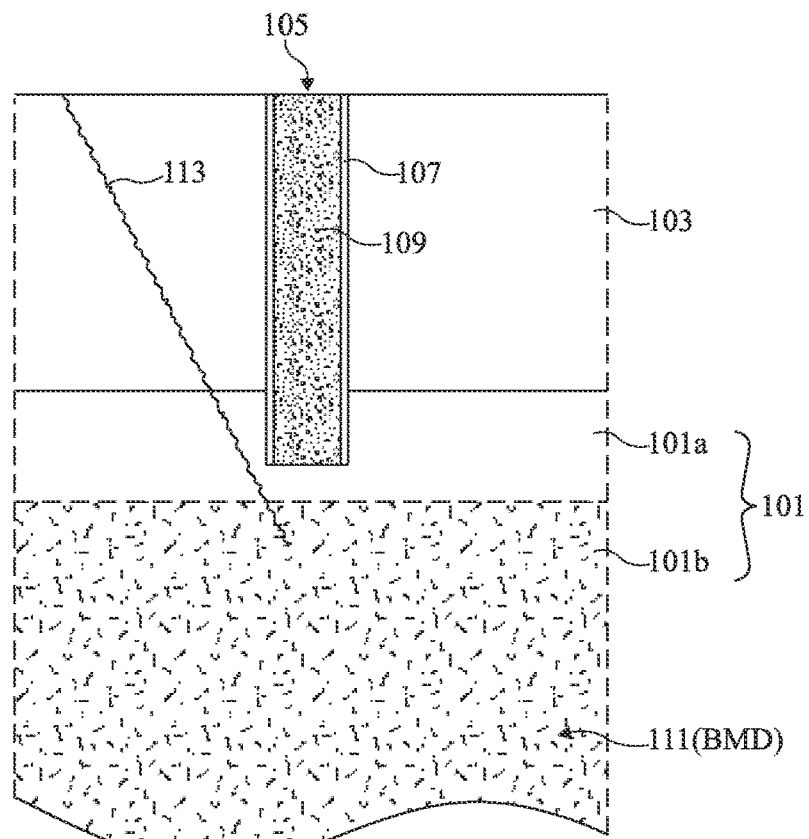
FIG. 1 is a cross-section view schematically showing a portion of an example of a semiconductor integrated circuit chip.

FIG. 1 is a cross-section view schematically showing a portion of an example of a semiconductor integrated circuit chip in BCD technology.

The integrated circuit chip comprises a heavily-doped P-type (P++) single-crystal silicon substrate (also referred to herein as a substrate or semiconductor substrate) 101. Substrate 101, for example, has an electric resistivity in the order of 10 mΩ·cm or more. As an example, substrate 101 has a doping level greater than $5*10^{17}$ atoms/cm$^3$, for example, in the order of $10^{18}$ atoms/cm$^3$ or more. Substrate 101 is, for example, boron-doped.

The integrated circuit chip further comprises, on top of and in contact with the upper surface of substrate 101, an epitaxial layer 103 made of lightly-doped P-type (P-) single crystal silicon. Epitaxial layer 103 for example has an electric resistivity in the order of 50 Ω·cm or less, for example, in the order of 10 Ω·cm. As an example, epitaxial layer 103 has a doping level smaller than $10^{16}$ atoms/cm$^3$, for example, in the order of $10^{15}$ atoms/cm$^3$. The thickness of epitaxial layer 103 is for example in the range from 3 to 30 μm, for example, in the order of 15 μm.

The chip of FIG. 1 for example comprises electronic components, particularly transistors, not detailed, formed inside and on top of epitaxial layer 103.

The chip further comprises vertical insulation trenches 105, laterally insulating different portions of the chip. For simplification, a single trench 105 has been shown in FIG. 1. Trench 105 extends vertically from the upper surface of epitaxial layer 103, thoroughly crosses a thickness of the epitaxial layer, and stops in an upper portion of substrate 101. In this example, the lateral walls of trench 105 are coated with an insulating layer 107, for example, made of silicon oxide, and the trench is filled with an electrically-conductive region 109, for example, made of polycrystalline silicon, preferably doped polycrystalline silicon, for example boron doped polycrystalline silicon. In the shown example, insulating layer 107 is interrupted at the bottom of trench 105. Thus, conductive region 109 is in (physical and electrical) contact with substrate 101 at the bottom of trench 105, and laterally insulated from epitaxial layer 103 by insulating layer 107. As a variant, the insulating layer 107 is not interrupted at the bottom of the trench, so as to insulate the conductive region 109 from the substrate 101. As another variant, trench 105 is completely filled with an insulating material, for example silicon oxide. Trench 105, for example, has a depth in the range from 15 to 35 μm, for example, in the order of 27 μm.

As schematically shown in FIG. 1, substrate 101 comprises bulk microdefects (BMDs) 111. Microdefects 111 are linked to the presence of interstitial oxygen in the substrate (bulk) 101, resulting from the bulk manufacturing method. During the different chip manufacturing steps, certain thermal treatments, typically at temperatures in the range from 600° C. to 900° C., for example from 600° C. to 800° C., for example, from 700° C. to 800° C., cause the forming of nuclei of silicon dioxide ($SiO_2$), which develop into BMDs. The dimensions of the BMDs are, for example, in the order of from a few nanometers to one micron. The BMD density is particularly high in a heavily boron-doped substrate 101 as illustrated for the manufacturing of semiconductor integrated circuit chips in BCD technology.

As schematically shown in FIG. 1, an upper surface portion 101a of the substrate 101 does not contain or contains a reduced density of BMDs. The BMDs are mainly concentrated in a lower portion 101b of substrate 101 located under portion 101a. The absence or the reduced density of BMDs in the upper portion 101a of the substrate 101 is linked to the fact that at the beginning of the chip manufacturing method, before the nucleation of the BMDs, the substrate is submitted to high temperatures, for example, higher than 1,000° C., or even higher than 1,100° C. Such a high-temperature thermal treatment, for example, occurs during the forming of epitaxial layer 103. At this temperature, the BMD nucleation does not take place. At this temperature, an out-diffusion of the interstitial oxygen present in the upper portion 101a of the substrate 101 occurs. In other words, the upper portion 101a of the substrate 101, referred to as a denuded zone, depletes of interstitial oxygen. The upper portion 101a of the substrate 101 thus has a relatively low interstitial oxygen concentration. As a result, in the rest of the method, the BMDs do not form in the upper portion 101a of the substrate.

In the example shown in FIG. 1, trench 105 stops in the denuded zone 101a of substrate 101, before reaching the lower portion 101b containing the BMDs. However, the distance between the bottom of trench 105 and the lower (non-denuded) portion 101b of the substrate is relatively small. As an example, the thickness of denuded zone 101a is smaller than 10 µm, and the distance between the bottom of trench 105 and the lower (non-denuded) portion 101b of substrate 101 is less than 5 µm, for example, less than 2 µm. In this configuration, the stress induced by trenches 105 may cause dislocations having as starting points BMDs located in the vicinity of trenches 105 and capable of extending to the upper surface of epitaxial layer 103. An example of such a dislocation 113 has been schematically shown in FIG. 1. Such dislocations may result in malfunctions of the integrated circuit chip, and in particular in current leakages. In other examples (not shown), trench 105 may reach the lower portion 101b containing the BMDs, in which case the situation is even worse.

Figure 2:
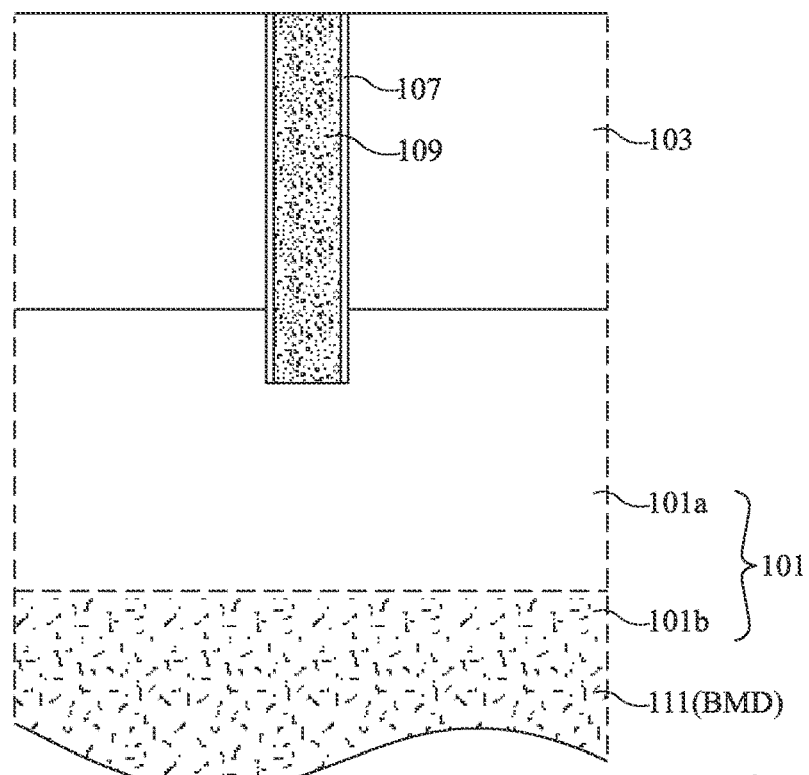
FIG. 2 is a cross-section view schematically showing a portion of an example of a semiconductor integrated circuit chip according to an embodiment.

FIG. 2 is a cross-section view schematically showing a portion of an example of an embodiment of a semiconductor integrated circuit chip in BCD technology.

The integrated circuit chip of FIG. 2 differs from the integrated circuit chip of FIG. 1 essentially in that, in the integrated circuit chip of FIG. 2, the thickness of the denuded zone 101a of substrate 101 is greater than that of the integrated circuit chip of FIG. 1. Thus, in the integrated circuit chip of FIG. 2, the distance between the bottom of trench 105 and lower portion 101b (non-denuded portion of the substrate) is greater than that of the integrated circuit chip of FIG. 1.

As an example, in the integrated circuit chip of FIG. 2, the thickness of denuded zone 101a is greater than or equal to 15 µm, for example, greater than or equal to 20 µm, for example in the range from 15 to 40 µm. The distance between the bottom of trench 105 and the lower (non-denuded) portion 101b of the substrate is, for example, greater than or equal to 10 µm, for example in the range from 10 to 20 µm.

The increase of the distance between the bottom of trenches 105 and the BMDs enables to avoid the forming of dislocations under the effect of the stress induced by trenches 105.

According to an aspect of an embodiment, and as will be described in further detail hereafter in relation with FIGS. 5 and 6, to obtain a denuded zone 101a sufficiently deep to avoid dislocations, before or after a step of forming the epitaxial layer 103, and before any other thermal treatment step of significant duration, for example, having a duration longer than 30 minutes or longer than 60 minutes, at a temperature in the range from 600 to 900° C., for example from 600° C. to 800° C. (referred to as a BMD nucleation temperature range), a specific thermal treatment step called a denuding thermal treatment is provided, during which the substrate 101 is taken to a temperature higher than or equal to 1,000° C., for example, higher than or equal to 1,100° C., for example higher than or equal to 1,150° C., for a duration of several hours, for example, for more than four hours, for example for a duration in the order of six hours.

The denuding thermal treatment enables, before the BMD nucleation, out-diffusion of the interstitial oxygen of the substrate out of an upper layer 101a having a relatively large thickness, for example, in the range from 15 to 40 µm. During the nucleation of the BMDs, the latter then essentially form under denuded zone 101a, in the lower portion 101b of the substrate.

Figure 3:
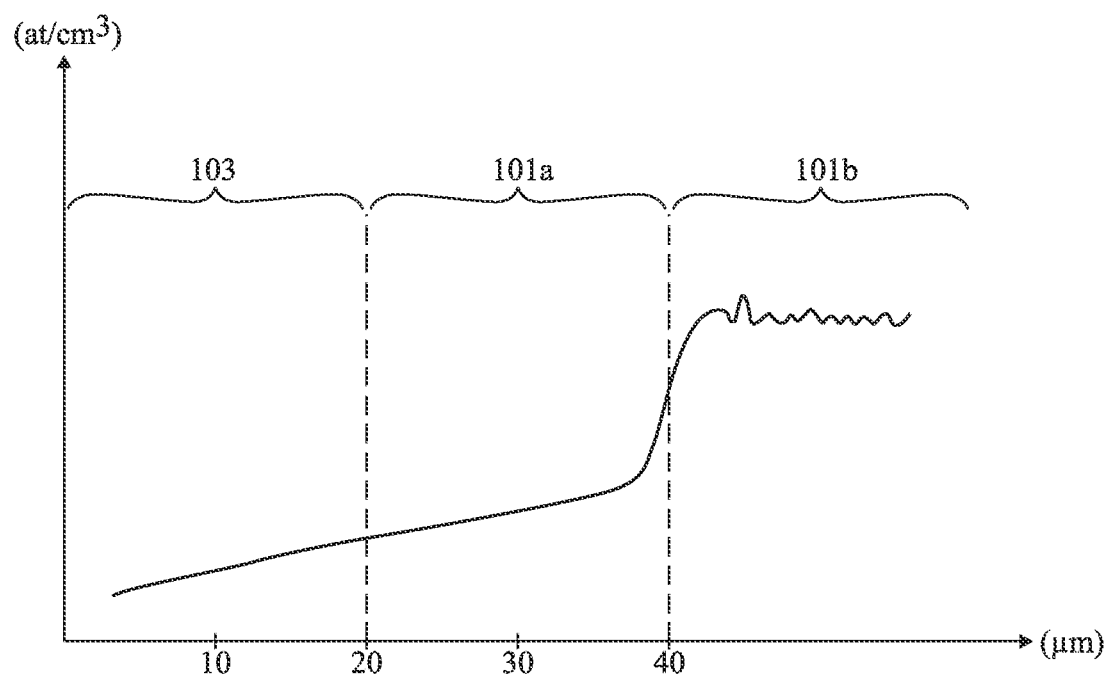
FIG. 3 is a diagram illustrating the variation according to depth of the interstitial oxygen concentration across the semiconductor substrate of a semiconductor integrated circuit chip according to an embodiment.

FIG. 3 is a diagram illustrating the variation according to depth (in abscissas in micrometers), of the interstitial oxygen concentration (in ordinates, in atoms/cm$^3$), in the stack formed by substrate 101 and epitaxial layer 103.

As appears in the curve of FIG. 3, the interstitial oxygen concentration is relatively small in layers 103 and 101a, and relatively high in the lower portion 101b of substrate 101, and exhibits an abrupt step at the interface between denuded zone 101a and the lower portion 101b of substrate 101.

Figure 4:
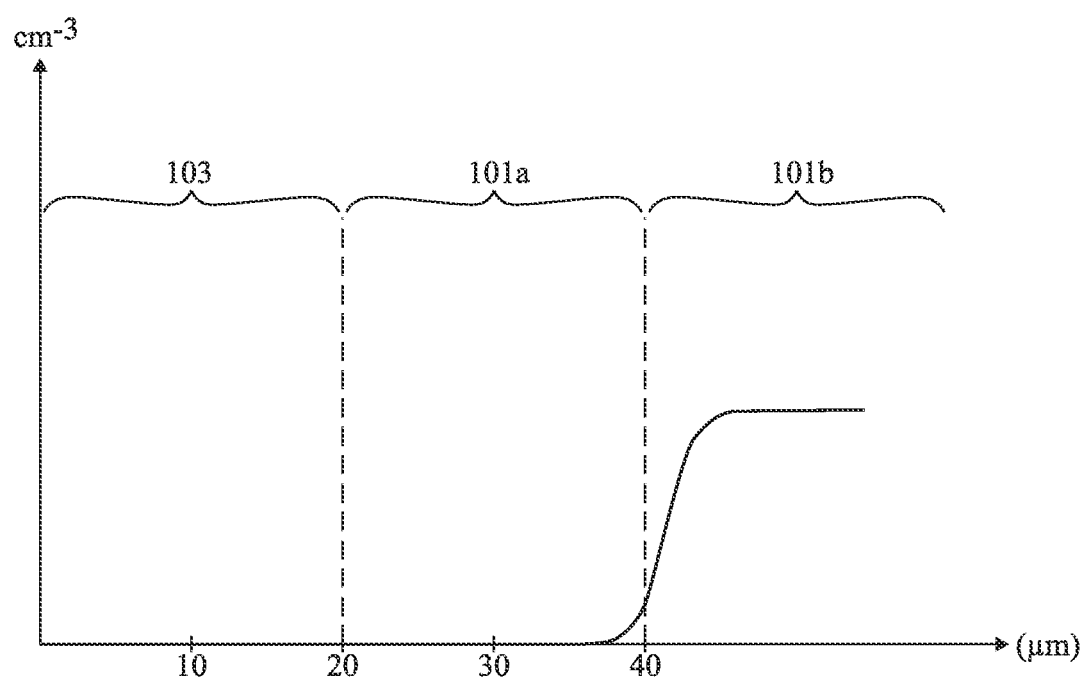
FIG. 4 is a diagram illustrating the variation according to depth of the density of microdefects across the semiconductor substrate of a semiconductor integrated circuit chip according to an embodiment.

FIG. 4 is a diagram illustrating the variation, according to depth (in abscissas, in micrometers), of the BMD density (in ordinates, in cm$^{-3}$) in the stack formed by substrate 101 and epitaxial layer 103.

As appears in the curve of FIG. 4, the BMD density is null or negligible in epitaxial layer 103 and in the denuded zone 101a of the substrate and relatively high in the lower portion 101b of substrate 101, and exhibits an abrupt step at the interface between denuded zone 101a and the lower portion 101b of substrate 101.

Figure 5:
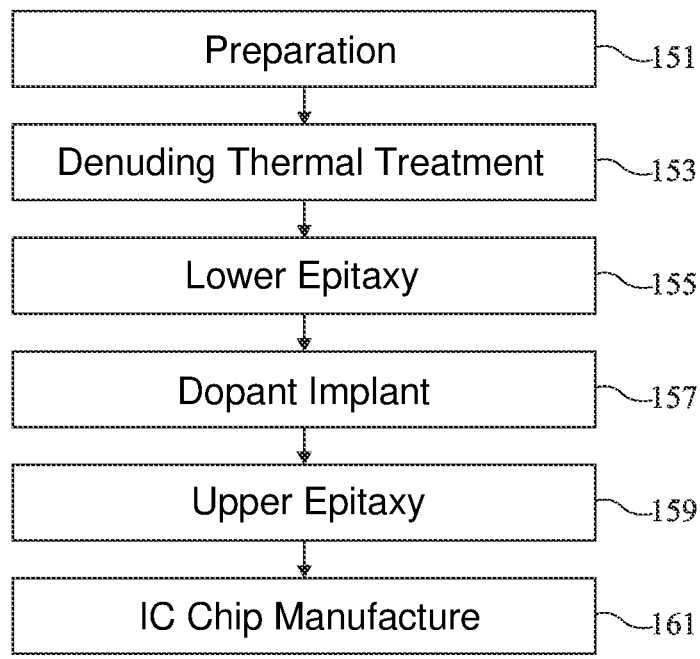
FIG. 5 is a diagram showing in the form of blocks an example of a method of manufacturing a semiconductor integrated circuit chip according to an embodiment.

FIG. 5 is a diagram showing in the form of blocks an example of a method of manufacturing a semiconductor integrated circuit chip in BCD technology according to an embodiment.

The method of FIG. 5 comprises a step 151 of supply or provision of substrate 101. At this stage, substrate 101 is for example a bare heavily-doped P-type single-crystal silicon substrate. The thickness of substrate 101 is for example in the range from 720 to 780 µm. Substrate 101 for example has a generally circular shape with a diameter in the order of 200 to 300 mm.

During step 151, steps of substrate preparation may be implemented, for example, a two-face polishing of the substrate, that is, a step of polishing of the lower and upper surfaces of the substrate, followed by a deposition of low temperature oxide on the back-surface of the substrate. Optionally, a polycrystalline silicon layer can be formed between the low temperature oxide and the substrate.

After step 151, a thermal processing step 153 is implemented, this step corresponding to the step of thermal treatment for denuding substrate 101. During step 153, substrate 101 is maintained at a temperature higher than or equal to 1,000° C., for example, higher than or equal to 1,100° C., for example, higher than or equal to 1,150° C., for example, in the order of 1,200° C., for a duration of several hours, for example for more than four hours, for example, for a duration in the order of six hours. This step is implemented before any other step of thermal treatment of substrate 101 of significant duration, for example, having a duration longer than 30 minutes or longer than 60 minutes, at a temperature in the range from 600 to 900° C., for example from 600° C. to 800° C. (BMD nucleation range). The denuding thermal treatment may be implemented under a neutral atmosphere, for example, under an atmosphere mainly formed of argon or nitrogen (N$_2$) and, possibly, of a small quantity of oxygen (O$_2$), for example, less than 5% of oxygen. Alternatively, pure hydrogen at atmospheric or under atmospheric pressure can be used. During this step, all or part of the interstitial oxygen initially present in upper portion 101a of substrate 101 diffuses out of said portion 101a, to obtain a denuded upper interstitial oxygen portion 101a.

After step 153, a step 155 of forming of a lower portion of epitaxial 103 is implemented. As an example, during this step, a lightly-doped P-type epitaxial single-crystal silicon layer, for example, having a thickness in the order of 15 µm, is formed on top of and in contact with the upper surface of substrate 101.

In this example, after step 155, a step 157 of implantation of an N-type dopant element, for example, antimony, in an upper surface portion of the epitaxial silicon layer formed at step 155, is implemented. After this surface implantation, an anneal of activation of the dopant elements may be implemented, for example, at a temperature in the range of 1,100 to 1,200° C.

After step 157, a step 159 of forming of an upper portion of epitaxial layer 103 is implemented. During this step, a lightly-doped P-type single-crystal epitaxial layer, for example, having a thickness in the order of 4 μm, is formed on top of and in contact with the upper surface of the epitaxial layer formed at step 155. Layer 103 is formed by the stack of the epitaxial layers formed at steps 155 and 159.

In FIG. 5, a step 161 subsequent to step 159 has been shown. This step schematically shows the rest of the semiconductor integrated circuit chip manufacturing method, particularly comprising the forming of transistors inside and on top of epitaxial layer 103 and the forming of insulating trenches 105. This method particularly comprises steps of thermal treatment at temperatures in the range from 600° C. to 900° C., for example from 600° C. to 800° C., for example, in the order of 800° C., resulting in the nucleation of the BMDs in the lower portion 101b of substrate 101.

As a variant, steps 157 and 159 may be omitted. In that case, layer 103 is formed in a single epitaxial step (step 155), after the denuding thermal treatment (step 153).

Figure 6:
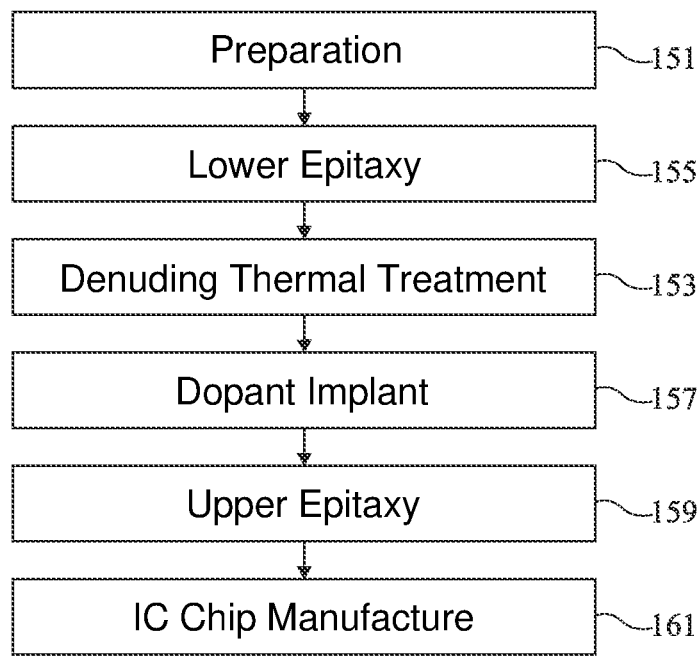
FIG. 6 is a diagram showing, in the form of blocks, another example of a method of manufacturing a semiconductor integrated circuit chip according to an embodiment.

FIG. 6 is a diagram showing in the form of blocks another example of a method of manufacturing a semiconductor integrated circuit chip in BCD technology according to an embodiment.

The method of FIG. 6 differs from the method of FIG. 5 essentially in that, in the method of FIG. 6, step 153 of denuding thermal treatment is implemented after the first epitaxy step 155, and before any other step of thermal treatment of substrate 101 of significant duration, for example, having a duration longer than 30 minutes or longer than 60 minutes, at a temperature in the range from 600 to 900° C., for example from 600° C. to 800° C. (BMD nucleation range).

Steps 157, 159, and 161 are successively implemented after step 153.

Again, as a variant, steps 157 and 159 may be omitted. In that case, layer 103 is formed in a single epitaxial step (step 155), before the denuding thermal treatment.

Various embodiments and variants have been described. Those skilled in the art will understand that certain features of these various embodiments and variants may be combined, and other variants will occur to those skilled in the art. In particular, although an example of application to semiconductor integrated circuit chips in BCD technology has been described hereabove, the described embodiments are not limited to this specific case. In particular, the described embodiments apply to the forming of any chip comprises a P-type doped single-crystal silicon substrate having a first doping level, coated with an epitaxial P-type doped single-crystal silicon layer having a second doping level lower than the first level. More generally, the described embodiments apply whatever the doping type and the doping level of the substrate 101 and the epitaxial layer 103. For example, the descried embodiments apply to an P-type substrate 101 covered with an N-type epitaxial layer 103, or to an N-type substrate 101 covered with an N-type epitaxial layer 103, or to an N-type substrate 101 covered with an P-type epitaxial layer 103. Furthermore, the described embodiments apply to a substrate 101 having a doping level lower than the doping level of the epitaxial layer 103. The described embodiments are particularly advantageous in the case of chips comprising vertical insulation trenches thoroughly crossing the epitaxial layer and emerging into the substrate.

Further, the embodiments are not limited to the examples of dimensions mentioned hereabove.

The invention claimed is:

1. A method of manufacturing a semiconductor structure, comprising the steps of:
    a) providing a doped single-crystal semiconductor substrate;
    b) applying a denuding thermal treatment to the doped single-crystal semiconductor substrate at a temperature higher than or equal to 1,000° C. for a period of time in an atmosphere consisting essentially of argon or nitrogen to produce a denuded doped single-crystal semiconductor substrate;
    c) epitaxially growing a doped single-crystal semiconductor layer on top of and in contact with an upper surface of the denuded doped single-crystal semiconductor substrate; and
    d) performing, after steps a), b) and c), a thermal treatment of the denuded doped single-crystal semiconductor substrate at a temperature in a range from 600° C. to 900° C.

2. The method according to claim 1, wherein said period of time is at least four hours.

3. The method according to claim 1, wherein step d) comprises forming a vertical insulation trench crossing through a thickness of the doped single-crystal semiconductor layer and emerging into a denuded region of the denuded doped single-crystal semiconductor substrate.

4. The method according to claim 3, wherein forming the vertical insulation trench comprises:
    forming an insulating layer on lateral walls and at the bottom of the vertical insulation trench; and
    filling of the vertical insulation trench with an electrically-conductive material.

5. The method of claim 3, wherein the denuded region has a first interstitial oxygen concentration smaller than a second interstitial oxygen concentration of a region of the doped single-crystal semiconductor substrate below the denuded region.

6. The method according to claim 1, wherein the doped single-crystal semiconductor substrate is P-type doped and the doped single-crystal semiconductor layer is P-type doped.

7. The method according to claim 6, wherein the doped single-crystal semiconductor substrate has a first doping level, and the doped single-crystal semiconductor layer has a second doping level lower than the first doping level.

8. The method according to claim 1, wherein the doped single-crystal semiconductor substrate has a doping level greater than $5*10^{17}$ atoms/cm$^3$.

9. The method according to claim 1, wherein the doped single-crystal semiconductor substrate has a doping level greater than $10^{18}$ atoms/cm$^3$.

10. The method according to claim 1, wherein the doped single-crystal semiconductor substrate is boron-doped.

11. The method according to claim 1, wherein the doped single-crystal semiconductor layer has a doping level smaller than $10^{16}$ atoms/cm$^3$.

12. The method according to claim 1, wherein the doped single-crystal semiconductor layer has a doping level in the order of $10^{15}$ atoms/cm$^3$.

13. The method according to claim 1, wherein step b) comprises maintaining the doped single-crystal semiconductor substrate at a temperature higher than or equal to 1,100° C. for at least four hours.

14. The method of claim 1, wherein the semiconductor structure is a semiconductor integrated circuit chip.

15. The method of claim 1, wherein the semiconductor structure is a semiconductor substrate.

16. The method of claim 1, wherein step a) comprises:
- a1) polishing both upper and lower surfaces of the doped single-crystal semiconductor substrate;
- a2) depositing a low temperature oxide layer over the lower surface of the doped single-crystal semiconductor substrate.

17. The method of claim 16, further comprising, between steps a1) and a2), forming a polysilicon layer on the lower surface of the doped single-crystal semiconductor substrate.

18. The method of claim 1, wherein step c) comprises:
- c1) forming a lower epitaxial layer portion lightly doped with a first type dopant;
- c2) implanting second type dopant in the lower epitaxial layer portion;
- c3) annealing to activate the second type dopant; and
- c4) forming an upper epitaxial layer portion on the lower epitaxial layer portion, said upper epitaxial layer portion being doped with the first type dopant.

* * * * *